(12) United States Patent
Sekimoto

(10) Patent No.: US 6,943,634 B2
(45) Date of Patent: Sep. 13, 2005

(54) OSCILLATION DETECTION CIRCUIT

(75) Inventor: Yasuhiko Sekimoto, Hamakita (JP)

(73) Assignee: Yamaha Corporation, Hamamatsu (JP)

( * ) Notice: Subject to any disclaimer, the term of this patent is extended or adjusted under 35 U.S.C. 154(b) by 19 days.

(21) Appl. No.: 10/396,094

(22) Filed: Mar. 25, 2003

(65) Prior Publication Data

US 2003/0184391 A1 Oct. 2, 2003

(30) Foreign Application Priority Data

Mar. 27, 2002 (JP) .......................... 2002-089332

(51) Int. Cl.$^7$ .............................................. H03B 1/00
(52) U.S. Cl. ........................... 331/74; 331/1 A; 327/292
(58) Field of Search ...................... 331/74, 1 A; 710/8, 710/292

(56) References Cited

U.S. PATENT DOCUMENTS 6,343,334 B1 * 1/2002 Uemura et al. ................ 710/8

FOREIGN PATENT DOCUMENTS

| JP | 10-190413 | 7/1998 |
|---|---|---|
| JP | 11-220330 | 8/1999 |
| JP | 2000-122749 | 4/2000 |
| JP | 2001-326565 | 11/2001 |
| JP | 2002-043906 | 2/2002 |

* cited by examiner

Primary Examiner—Arnold Kinkead
(74) Attorney, Agent, or Firm—Pillsbury Winthrop Shaw Pittman LLP (57) ABSTRACT

An oscillation detection circuit is constituted by at least one circuitry comprising a first current source for charging a capacitor and a second current source for discharging the capacitor, which are connected in series via a switch controlled to be opened or closed in response to an output signal of an oscillation circuit, wherein the first current source is greater than the second current source in current value. Herein, a signal emerging at a connection point of the first and second current sources is integrated as the switch is repeatedly turned on and off in response to the oscillation signal whose level is periodically changed in an oscillation mode. A Schmitt trigger is arranged to produce a detection signal based on the signal at the connection point between the first and second current sources.

5 Claims, 9 Drawing Sheets

FIG. 1

FIG. 2A  NCKM

FIG. 2B  TRID

FIG. 2C  TRIU

FIG. 2D  OSCSTP t1  t2

FIG. 8B IN 
FIG. 8C INA

FIG. 8D INB 
FIG. 8E OUT

OSCILLATION DETECTION CIRCUIT

BACKGROUND OF THE INVENTION

1. Field of the Invention

This invention relates to oscillation detection circuits for detecting oscillations of oscillation circuits such as crystal oscillators, and in particular relates to oscillation detection circuits for avoiding operation errors due to dispersions and variations of circuit constants of oscillation circuits.

2. Description of the Related Art

Conventionally, oscillation circuits are installed in electronic devices to produce oscillation signals, based on which electronic circuits operate. In order to guarantee operations of circuitry inputting output signals of oscillation circuits, it is necessary to detect whether or not oscillation circuits are placed in oscillated states. Therefore, oscillation detection circuits are conventionally used, and various examples of oscillation detection circuits using delay circuits have been disclosed in Japanese Unexamined Patent Publication No. Hei 10-190413, Japanese Unexamined Patent Publication No. 2000-122749, and Japanese Unexamined Patent Publication No. 2002-43906, for example.

Figure 7A:
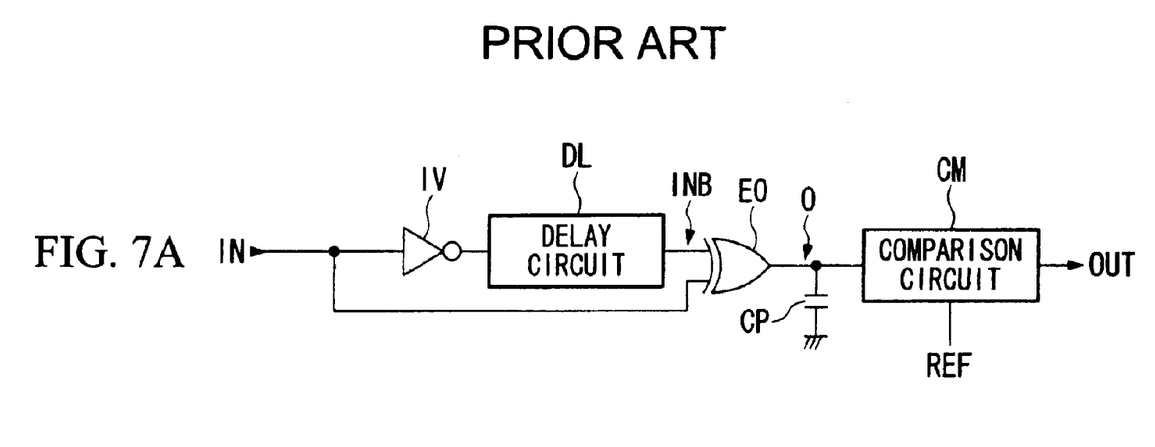
FIG. 7A is a circuit diagram showing the configuration of an oscillation detection circuit for detecting oscillation using a delay circuit.
Figure 7B:
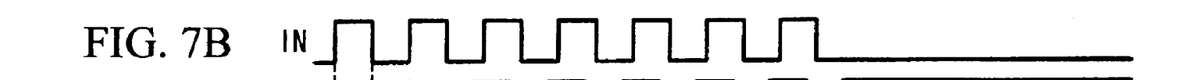
FIG. 7B shows an input signal IN corresponding to an output signal of an oscillation circuit.
Figures 7C, 7D:
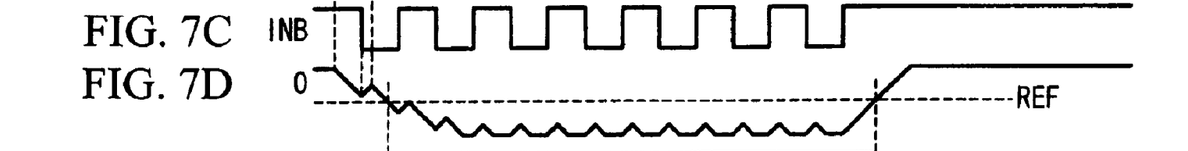
Figure 7E:
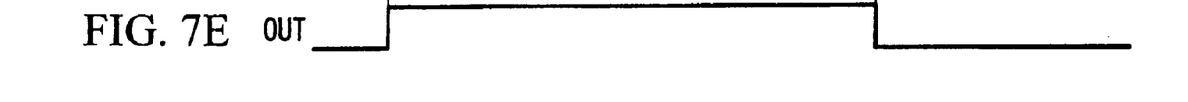
FIG. 7E shows an output signal OUT of a comparison circuit.

Now, the configuration and operation of an oscillation detection circuit using a delay circuit will be described with reference to FIGS. 7A to 7E. FIG. 7A shows the configuration of an oscillation detection circuit which is conventionally known, wherein an input signal IN corresponds to an output signal of an oscillation circuit (not shown), which is supplied to a first input terminal of an exclusive-or circuit EO via an inverter IV and a delay circuit DL and is also supplied directly to a second input terminal of the exclusive-or circuit EO. An output terminal of the exclusive-or circuit EO is grounded via a capacitor CP and is also connected to an comparison circuit CM, which compares between a potential (or voltage) "O" at the output terminal of the exclusive-or circuit EO and a reference voltage REF, thus producing an output signal OUT. That is, when the potential O becomes lower than the reference voltage REF, the output signal OUT becomes high.

Next, the overall operation of the oscillation detection circuit will be described with reference to FIGS. 7A to 7E. Before starting oscillation, the input signal IN is fixed at a high level or a low level, wherein the exclusive-or circuit EO receives an delayed signal INB, which is delayed from the input signal IN by the delay circuit D1, in addition to the input signal IN. In this case, the input signal IN and the delayed signal INB differ from each other in level, regardless of the level of the input signal IN, which is either a high level or a low level. That is, the output signal O of the exclusive-or circuit EO is fixed to a high level, so that the capacitor CP is being charged. Therefore, the comparison circuit CM receives such a high-level output signal O to produce a low-level output signal OUT.

When oscillation is started in the aforementioned initial state so that an oscillation signal whose level is periodically changed is applied as the input signal IN, which is inverted by the inverter IV and is then delayed by a prescribed delay time in the delay circuit DL, which in turn outputs the delayed signal INB. In this case, there may alternately occur first periods in which both the input signal IN and the delayed signal INB match in level and second periods in which the input signal IN and the delayed signal INB differ from each other in level. That is, the exclusive-or circuit EO receiving the input signal IN and delayed signal INB produces the output signal O, which is set to a low level in first periods or which is set to a high level in second periods. For this reason, when the oscillation circuit is placed in an oscillated state, charging and discharging are alternately effected on the capacitor CP.

When a discharged value exceeds a charged value, the capacitor CP may be observed in a discharged state apparently, so that the output signal O of the exclusive-or circuit EO, which may differ from the foregoing level established before oscillation is started, becomes a low level. Therefore, by detecting such a low-level output signal O of the exclusive-or circuit EO, it is possible to detect whether or not oscillation circuit is placed in an oscillated state (or an oscillation mode). That is, by adequately adjusting the delay time of the delay circuit DL in advance, a prescribed timing relationship is established between the input signal IN and the delayed signal INB in such a way that the discharged value exceeds the charged value in the oscillation mode.

The comparison circuit CM compares between the level of the output signal O and the reference voltage REF, so that when the level of the output signal O becomes lower than the reference voltage REF, the comparison circuit CM produces the output signal OUT of a high level, based on which an oscillation mode is detected.

Thereafter, when oscillation is stopped so that the input signal IN is fixed to a low level, for example, the delayed signal INB output from the delay circuit DL is fixed to a high level. That is, there occurs an unmatched condition where the input signal IN and the delayed signal INB do not match in level. In such an unmatched condition, the exclusive-or circuit EO receiving the input signal IN and delayed signal INB operates to charge the capacitor CP, thus producing the output signal O of a high level. When the level of the output signal O exceeds the reference voltage REF, the comparison circuit CM produces the output signal OUT of a high level, based on which an oscillation stop mode is detected.

In the aforementioned oscillation detection circuit of FIG. 7A, the capacitor CP is placed in a discharged state using the delay circuit DL. Of course, it is not always required to use the delay circuit in placing the capacitor in a discharged state. That is, Japanese Unexamined Patent Publication No. Hei 11-220330 and Japanese Unexamined Patent Publication No. 2001-326565 disclose other examples of oscillation detection circuits, in which oscillation is detected under discharged states of capacitors not using delay circuits.

Figure 8A:
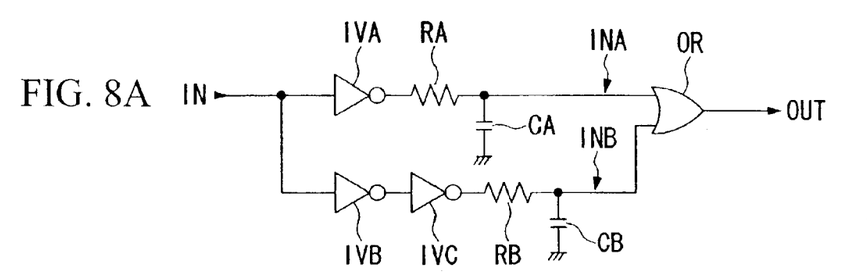
FIG. 8A is a circuit diagram showing the configuration of an oscillation detection circuit for detecting oscillation not using a delay circuit.
Figure 8B:
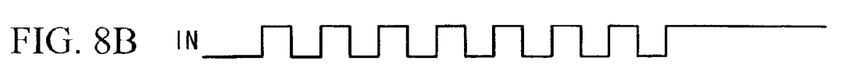
FIG. 8B shows an input signal IN corresponding to an output signal of an oscillation circuit.
Figures 8C, 8D, 8E:
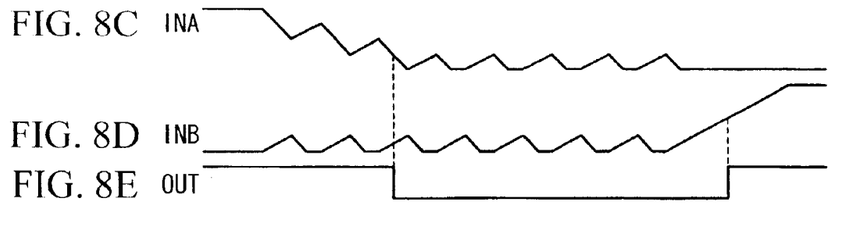
FIG. 8C shows variations of a signal INA subjected to a logical operation.
FIG. 8D shows variations of a signal INB subjected to the logical operation.
FIG. 8E shows an output of the logical operation.

Next, an example of the aforementioned oscillation detection circuit for detecting oscillation under a discharged state of a capacitor not using a delay circuit will be described with reference to FIGS. 8A to 8E. FIG. 8A shows the configuration of an oscillation detection circuit in which an input signal corresponding to an output signal of an oscillation circuit (not shown) is supplied to a first input terminal of a logical circuit OR as a signal INA via an inverter IVA, and an integration circuit consisting of a resistor RA and a capacitor CA, and it is also supplied to a second input terminal of the logical circuit OR as a signal INB via a buffer circuit consisting of inverters IVB and IVC, and an integration circuit consisting of a resistor RB and a capacitor CB. Each of the inverters IVA and IVC may be constituted by a pair of MOS (Metal-Oxide Semiconductor) transistors of different polarities, i.e., an NMOS transistor for outputting a low level and a PMOS transistor for outputting a high level, wherein on-resistance of the NMOS transistor is set smaller than on-resistance of the PMOS transistor.

Next, the operation of the oscillation detection circuit of FIG. 8A will be described with reference to FIGS. 8B to 8E.

Before oscillation is started, one of the signal INA or the signal INB is fixed to a high level in response to the level of the input signal IN, while the other is fixed to a low level. Therefore, the logical circuit OR inputting the signals INA and INB produces an output signal OUT having a high level. Before oscillation is started, the input signal IN is placed in a low level, so that the signal INA is high, while the signal INB is low.

When oscillation is started in the initial condition described above, the input signal IN periodically changes the level thereof (see FIG. 8B), and the inverter IVA produces an inverted signal whose level is inverted compared with the input signal IN. The inverted signal is then subjected to integration in the integration circuit consisting of the resistor RA and the capacitor CA. As described above, the inverter IVA is constituted by a pair of MOS transistors of different polarities, wherein on-resistance of one transistor outputting a low level is set smaller than on-resistance of the other transistor; therefore, the rise of the signal INA becomes sharp while the decay (or trail) of the signal INA becomes dull. For this reason, the signal INA that is initially set to a high level may repeatedly rise and fall in level thereof, so that it will be gradually reduced to a low level (see FIG. 8C).

The output signal of the inverter IVC that depends on the input signal IN is subjected to integration in the integration circuit consisting of the resistor RB and the capacitor CB, thus producing the signal INB. As described above, the inverter IVC is constituted by a pair of MOS transistors of different polarities, wherein on-resistance of one transistor outputting a low level is set smaller than on-resistance of the other transistor; therefore, the rise of the signal INB becomes sharp while the decay (or trail) of the signal INB becomes dull. For this reason, the signal INB may be substantially maintained at a low level while it repeatedly rises and falls in level thereof.

According to the aforementioned oscillation detection circuit of FIG. 8A, after the oscillation circuit starts oscillation, both the signals INA and INB are substantially placed in a low level, so that the logical circuit OR produces the output signal OUT of a low level. Thereafter, when oscillation is stopped so that the input signal is fixed to a high level, for example, the signal INA is fixed to a low level while the signal INB is fixed to a high level (see FIG. 8D), so that the logical circuit OR produces the output signal OUT of a high level. In summary, the output signal OUT of the logical circuit OR is maintained in a low level during an oscillation mode in which the oscillation circuit continuously performs oscillation. Thus, it is possible to detect oscillation in response to the level of the output signal OUT.

In the oscillation detection circuit of FIG. 7A, it is necessary to properly set the delay time of the delay circuit DL and to reduce dispersions of time constants for determining the rise time and decay time of the signal within a prescribed range. Otherwise, the oscillation detection circuit may have difficulties in detecting oscillation, which may cause a reduction of yield in production of circuits.

Figure 9A:
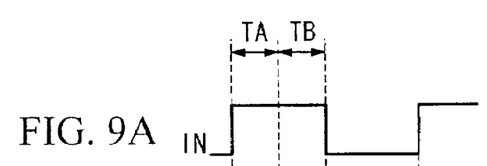
FIG. 9A shows an example of an input signal IN applied to the oscillation detection circuit of FIG. 7A in which a discharged value is equal to a charged value in a capacitor.
Figure 9B:
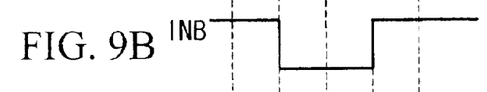
FIG. 9B shows a delayed signal INB produced based on the input signal IN of FIG. 9A.
Figure 9C:
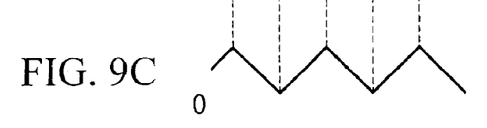
FIG. 9C shows variations of a signal O output from an exclusive-or circuit receiving the input signal IN and the delayed signal INB shown in FIGS. 9A and 9B.

The aforementioned problem will be described in more detail with reference to FIGS. 9A to 9I, wherein each of time periods TA represents a matched condition where both the signals IN and INB match each other in level so that the capacitor CP is being discharged, and each of time periods TB represents an unmatched condition where the signals IN and INB do not match each other in level so that the capacitor CP is being charged. FIGS. 9A to 9C show an example in which both the time periods TA and TB are identical to each other, wherein a charged value and a discharged value are equal to each other in the capacitor CP.

Figures 9D, 9E:
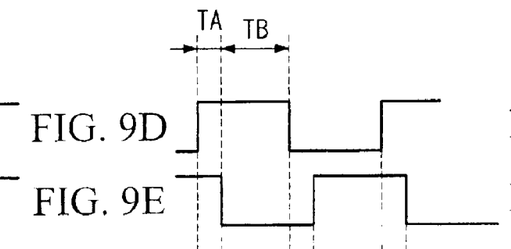
FIG. 9D shows an example of an input signal IN applied to the oscillation detection circuit of FIG. 7A in which a discharged value is smaller than a charged value in the capacitor.
FIG. 9E shows a delayed signal INB produced based on the input signal IN of FIG. 9D.
Figure 9F:
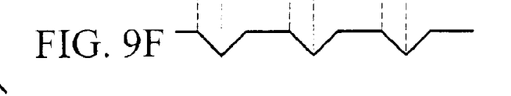
FIG. 9F shows variations of a signal O output from the exclusive-or circuit receiving the input signal IN and the delay signal INB shown in FIGS. 9D and 9E.

In this example, the average value of the level of the signal O output from the exclusive-or circuit EO is stabilized and is set to an intermediate value between the source voltage and the ground potential, so that the signal O is not set to a low level, which makes oscillation detection inoperable. FIGS. 9D to 9F show an example in which the time period TA is shorter than the time period TB, wherein a discharged value is smaller than a charged value in the capacitor CP. In this example, the signal O is maintained in a high level and is not reduced to a low level, which makes oscillation detection inoperable as well.

Figures 9G, 9H:
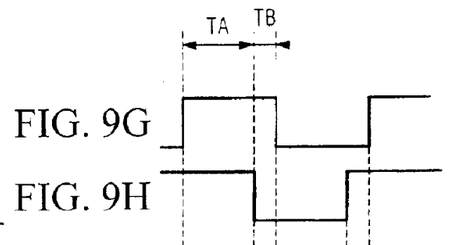
FIG. 9G shows an example of an input signal IN applied to the oscillation detection circuit of FIG. 7A in which a discharged value is greater than a charged value in the capacitor.
FIG. 9H shows a delayed signal INB produced based on the input signal IN of FIG. 9G.
Figure 9I:
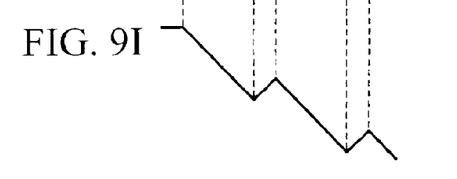
FIG. 9I shows variations of a signal O output from the exclusive-or circuit receiving the input signal IN and the delayed signal INB shown in FIGS. 9G and 9H.

FIGS. 9G to 9I show an example in which the time period TA is longer than the time period TB, wherein a discharged value is greater than a charged value. Therefore, during the oscillation mode of the oscillation circuit in progress, the signal O is gradually reduced to a low level, which makes oscillation detection operable.

As described above, the operability of oscillation detection greatly depends upon a relationship between the discharged value and charged value of the capacitor CP, which in turn depends upon various factors such as the delay time of the delay circuit DL, and time constants for determining the rise time and decay time of the signal O. Therefore, it is necessary to properly adjust these factors.

However, if the delay time of the delay circuit DL is greatly varied or if the time constants are greatly varied due to dispersions of on-resistances of transistors constituting the exclusive-or circuit EO, there may occur an undesired situation where the discharged value does not exceed the charged value. This makes oscillation detection inoperable, which may cause a reduction of yield in production of circuits.

The aforementioned oscillation detection circuit of FIG. 8A may have a similar problem, wherein both the signals INA and INB are not simultaneously placed in a low level due to unexpected dispersions of on-resistances of transistors constituting the inverters INA to INC, in other words, either one of the signals INA and INB may be unexpectedly placed in a high level. This makes oscillation detection inoperable.

SUMMARY OF THE INVENTION

It is an object of the invention to provide an oscillation detection circuit that can detect an oscillation mode of an oscillation circuit in a stable manner without being badly affected by dispersions of characteristics of transistors.

An oscillation detection circuit of this invention is constituted by at least one circuitry comprising a first current source for charging a capacitor and a second current source for discharging the capacitor, which are connected in series via a switch controlled to be opened or closed in response to an output signal (or an oscillation signal) of an oscillation circuit, wherein the first current source is greater than the second current source in current value. Herein, a signal emerging at a connection point of the first and second current sources is integrated as the switch is repeatedly turned on and off in response to the oscillation signal whose level is periodically changed in an oscillation mode. A Schmitt trigger is arranged to produce a binary signal based on the signal at the connection point between the first and second current sources. When two series of circuitry are arranged in such a way that one signal is gradually increased while the other signal is gradually decreased in the oscillation mode, these signals are respectively supplied to Schmitt triggers to produce binary signals, based on which a detection signal representing an oscillation mode or a non-oscillation mode is produced through an AND operation therebetween.

In the above, it is possible to additionally arrange a current breaking circuit for temporarily making the first current source or the second current source inoperable as necessary, whereby it is possible to completely eliminate ripple contained in the signal at the connection point, thus avoiding occurrence of glitch in the detection signal.

BRIEF DESCRIPTION OF THE DRAWINGS

These and other objects, aspects, and embodiments of the present invention will be described in more detail with reference to the following drawings, in which:

FIG. 7C shows a delayed signal INB that is produced by inverting and delaying the input signal IN;

FIG. 7D shows variations of the level of an output signal O compared with a reference voltage REF;

DESCRIPTION OF THE PREFERRED EMBODIMENTS

This invention will be described in further detail by way of examples with reference to the accompanying drawings.

1. First Embodiment

Figure 1:
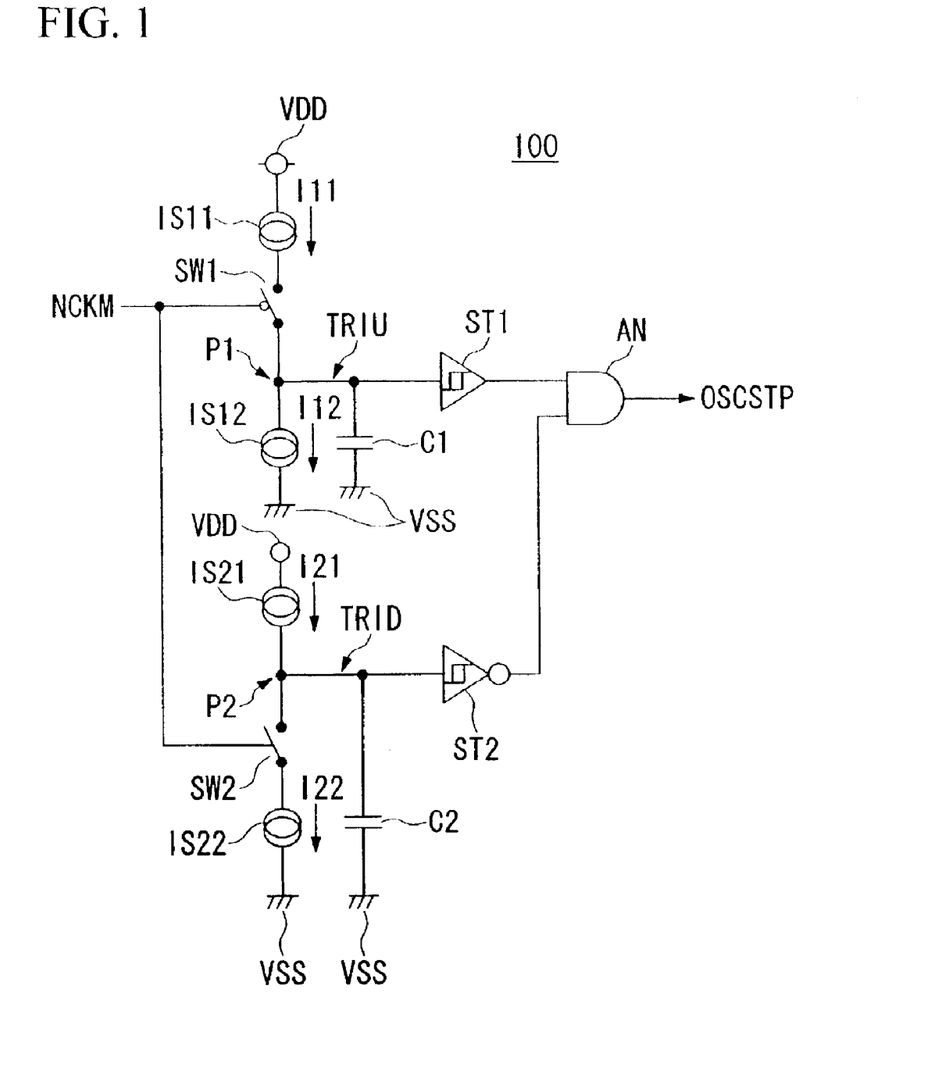
FIG. 1 a circuit diagram showing the configuration of an oscillation detection circuit in accordance with a first embodiment of the invention.

FIG. 1 shows the configuration of an oscillation detection circuit in accordance with a first embodiment of the invention. That is, an oscillation detection circuit 100 of FIG. 1 is designed to detect oscillation (or an oscillation mode) of an oscillation circuit (not shown), wherein a capacitor is repeatedly charged and discharged by a current source producing a relatively large current that is turned on and off based on an oscillation signal, while another capacitor is repeatedly charged and discharged by a current source producing a relatively small current.

In FIG. 1, a current source IS11 and a current source IS12 are connected in series between a voltage source (or a supply voltage) VDD and a ground potential VSS, wherein they differ from each other in current values, that is, the current value of the current source IS11 is set greater than the current value of the current source IS12. While satisfying such a relationship between the current values of the current sources IS11 and IS12, a prescribed ratio is set between the current values of the current sources IS11 and IS12. For example, the current value of the current source IS11 is set to 18 micro-amperes ($\mu A$) or so, while the current value of the current source IS12 is set to 3 micro-amperes ($\mu A$) or so. One electrode of a capacitor C1 is connected with the ground potential VSS, and the other electrode is connected with a connection point P1 between the current source IS11 and IS12. The capacitor C1 acts as an integrator. Of course, the capacitor C1 can be connected between the connection point P1 and the voltage source VDD. That is, one electrode of the capacitor C1 can be selectively connected with the voltage source VDD or the ground potential VSS.

A switch SW1 is inserted between the current source IS11 and the connection point P1, wherein it operates to open or close based on an output signal (or an oscillation signal) NCKM of an oscillation circuit (not shown). In an oscillation mode, the current source IS11 turns on or off a current I11 thereof based on the oscillation signal NCMK of the oscillation circuit. In addition, the connection point P1 is followed by a Schmitt trigger ST1 acting as a waveform shaping circuit, so that an integrated signal produced by the capacitor C1 is subjected to waveform shaping to produce a binary signal.

In addition to the aforementioned circuitry constituted by the current sources IS11, IS12, capacitor C1, switch SW1, and Schmitt trigger ST1, there is arranged another "complementary" circuitry that is constituted by current sources IS21, IS22, a capacitor C2, a switch SW2, and a Schmitt trigger ST2. Specifically, the current sources IS21 and IS22 are connected in series between the voltage source VDD and the ground potential VSS. One electrode of the capacitor C2 acting as an integrator is connected with the ground potential VSS, and the other electrode is connected with a connection point P2 between the current sources IS21 and IS22. Herein, current values of the current sources IS21 and IS22 greatly differ from each other, wherein the current value of the current source IS22 is set sufficiently greater than the current value of the current source IS21. For example, the current value of the current source IS22 is set to 18 $\mu A$ or so, and the current value of the current source IS21 is set to 3 $\mu A$ or so.

The switch SW2 is inserted between the current source IS21 and the connection point P2 (on the current path of the current source IS22). This switch SW2 operates complementarily to the aforementioned switch SW1, wherein it operates to open or close based on the output signal NCKM of the oscillation circuit. In the present embodiment, the switch SW1 is closed while the switch SW2 is opened when the output signal NCKM is low. When the output signal NCKM is high, the switch SW1 is opened while the switch SW2 is closed. The connection point P2 is followed by the Schmitt trigger ST2 acting as a waveform shaping circuit, wherein the Schmitt trigger ST2 has an inverting function compared with the aforementioned Schmitt trigger ST1.

Output signals of the Schmitt triggers ST1 and ST2 are supplied to an AND circuit AN, which in turn produces a detection signal OSCSTP for use in detection of oscillation of the oscillation circuit.

In the present embodiment, the detection signal OSCSTP basically indicates an oscillation mode in progress, in other words, it may indicate an oscillation stop mode. It may be possible to adequately determine the role of the detection signal OSCSTP whether to indicate an oscillation mode or an oscillation stop mode, in response to the usage thereof.

Next, the overall operation of the oscillation detection circuit of FIG. 1 will be described with reference to FIGS. 2A to 2D.

In a non-oscillation mode of the oscillation circuit, when the output signal NCKM is fixed to a low level, the switch SW1 is closed so that a current path is formed between the voltage source VDD and the capacitor C1, wherein a current I11 flows from the current source IS11 coupled with the voltage source VDD to one electrode of the capacitor C1, which is thus being charged. In parallel with such a charging operation, the current source IS12 makes a current I12 to flow through the capacitor C1 towards the ground (VSS), so that the capacitor C1 is being discharged.

Therefore, the capacitor C1 may be apparently charged by a current difference, which is calculated by subtracting the current I12 from the current I11. Herein, the current I11 is sufficiently larger than the current I12, so that the level of a signal TRIU that emerges on one electrode of the capacitor C1 is increased up to the supply voltage VDD, thus exceeding a prescribed logical threshold of the Schmitt trigger ST1, which is set in advance with respect to a high level. That is, the Schmitt trigger ST1 inputting the signal TRIU produces a binary signal, which is set to a high level.

Since the output signal NCKM of the oscillation circuit is fixed to a low level, the switch SW2 is opened, thus preventing a current path from being established between the capacitor C2 and the current source IS22 with respect to the ground VSS. Therefore, only the current source IS21 makes a current I21 to flow into the capacitor C2, which is thus charged and is increased in level up to the supply voltage VDD. In this case, the level of a signal TRID that emerges on one electrode of the capacitor C2 exceeds a prescribed logical threshold VIH of the Schmitt trigger ST2, which is set in advance with respect to a high level. Thus, the Schmitt trigger ST2 inputting the signal TRID produces a binary signal, which is set to a low level.

As a result, in a non-oscillation mode of the oscillation circuit, when the output signal NCKM is fixed to a low level, the Schmitt trigger ST1 outputs a high level, while the Schmitt trigger ST2 outputs a low level. Therefore, the AND circuit AN performs an AND operation on these signals to produces a detection signal OSCSTP, which is placed in a low level.

In contrast, when the output signal NCKM of the oscillation circuit is fixed to a high level, the Schmitt trigger ST1 outputs a low level while the Schmitt trigger ST2 outputs a high level, whereas the detection signal OSCSTP output from the AND circuit AN is maintained in the low level. In summary, in a non-oscillation mode of the oscillation circuit, the oscillation detection circuit of FIG. 1 fixedly outputs the detection signal OSCSTP of a low level.

Next, the operation of the oscillation detection circuit responding to an oscillation mode of the oscillation circuit will be described in detail with reference to FIGS. 2A to 2D.

Figure 2A:
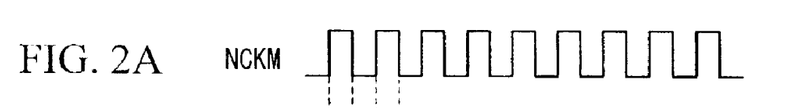
FIG. 2A shows an output signal NCKM of an oscillation circuit whose level is periodically changed in an oscillation mode.

In an oscillation mode of the oscillation circuit, the output signal NCKM is periodically changed in level as shown in FIG. 2A and is supplied to both the switches SW1 and SW2, which are thus repeatedly closed or opened in complementary manner. During repetition of closed and open states of the switch SW2, in each of time periods in which the output signal NCKM of the oscillation circuit is placed in a high level, the switch SW2 is closed so that the capacitor C2 is rapidly discharged in response to a current difference, which is calculated by subtracting a current I21 caused by the current source IS21 from a current I22 caused by the current source IS22. That is, the signal TRID is rapidly reduced in each of the aforementioned time periods in which the switch SW2 is closed in response to the output signal NCKM of a high level.

Figure 2B:
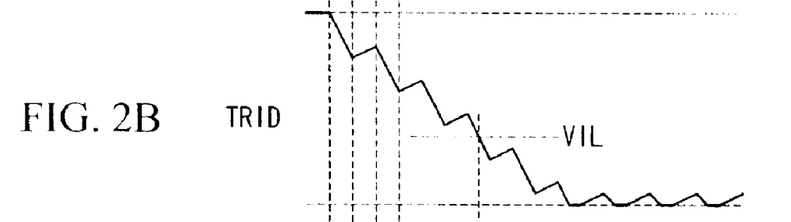
FIG. 2B shows variations of a signal TRID whose level is gradually reduced in the oscillation mode.

In each of other time periods in which the output signal NCKM of the oscillation circuit is placed in a low level, the switch SW2 is opened so that the capacitor C2 is charged by the current I21 of the current source IS21. Herein, the current I21 has a relatively small magnitude, so that the signal TRID is gradually increased in level. However, before the signal TRID is restored to an original level, the switch SW2 is closed again so that the signal TRID is further reduced in level. That is, in an oscillation mode of the oscillation circuit, the signal TRID must be gradually reduced in level, wherein at time t1, the signal TRID becomes lower than a prescribed logical threshold VIL of the Schmitt trigger ST2, which is set in advance with respect to a low level. Thus, the Schmitt trigger ST2 produces a binary signal of a high level.

Figure 2C:
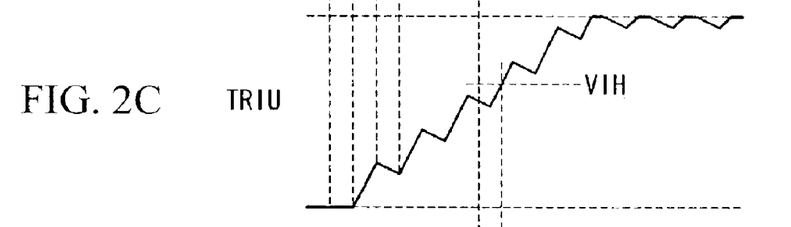
FIG. 2C shows variations of a signal TRIU whose level is gradually increased in the oscillation mode.

During repetition of the open and close states of the switch SW1 responding to the output signal NCKM of the oscillation circuit, in each of time periods in which the output signal NCKM is placed in a low level so that the switch SW1 is closed, the capacitor C1 is rapidly charged in response to a current difference, which is calculated by subtracting the current I12 of the current source IS12 from the current I11 of the current source IS11. That is, in each of the aforementioned time periods, the signal TRIU is rapidly increased in level.

Figure 2D:
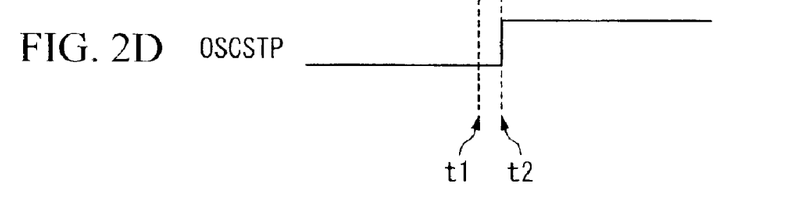
FIG. 2D shows a detection signal OSCSTP produced by the oscillation detection circuit of FIG. 1.

In each of time periods in which the output signal NCKM of the oscillation circuit is placed in a high level, the switch SW1 is opened so that the capacitor C1 is discharged in response to the current I12 of the current source IS12. Since the current I12 has a relatively small magnitude, the signal TRIU is gradually increased in level. However, before the signal TRIU is restored to an original level, the switch SW1 is closed again, so that the signal TRIU is further increased in level. Therefore, in an oscillation mode of the oscillation circuit, the signal TRIU must be gradually increased in level, wherein at time t2, the signal TRIU exceeds a prescribed logical threshold of the Schmitt trigger ST1, which is set in advance with respect to a high level. Thus, the Schmitt trigger ST1 produces a binary signal of a high level. As a result, the AND circuit AN performs an AND operation on the output signals of the Schmitt triggers ST1 and ST2, both of which are placed in a high level, thus producing the detection signal OSCSTP of a high level. In response to such a high-level detection signal OSCSTP, it is possible to detect an oscillation mode of the oscillation circuit.

2. Second Embodiment

Next, an oscillation detection circuit of a second embodiment of the invention will be described in detail, wherein the second embodiment is designed to eliminate a minor drawback of the first embodiment. Therefore, before describing the second embodiment, a description will be given with respect to the minor drawback of the first embodiment.

In the first embodiment shown in FIG. 1, ripples may occur in the signals TRIU and TRID, emerged at the connection points P1 and P2, due to repetition of open and closed states of the switches SW1 and SW2. Normally, ripples may be eliminated or absorbed by hysteresis characteristics of the Schmitt triggers ST1 and ST2, so that the detection signal OSCSTP would not be affected by ripples.

However, when ripples of the signals TRIU and TRID become apparent beyond absorbing capacities based on hysteresis characteristics of the Schmitt triggers ST1 and ST2, glitch may occur in the detection signal OSCSTP. For example, when the switch SW2 is closed so that the signal TRID becomes lower than the low-level logical threshold VIL of the Schmitt trigger ST2, the AND circuit AN produces the detection signal OSCSTP of a high level. Just after the detection signal OSCSTP turns to a high level, when the switch SW2 is opened, the capacitor C2 is gradually charged by the current I21 of the current source IS21, so that the signal TRID is increased in level.

As a result, the detection signal OSCSTP that is once placed in a high level is decreased thereafter, thus causing a glitch in the detection signal OSCSTP. Similarly, when the switch SW1 is opened just after the signal TRIU exceeds the high-level logical threshold VIH of the Schmitt trigger ST1, the capacitor C1 is gradually discharged by the current I12 of the current source IS12, so that the signal TRIU is dropped in level, thus causing a glitch in the detection signal OSCSTP. Therefore, the second embodiment is designed to avoid occurrence of a glitch in the detection signal OSCSTP, which may occur in the first embodiment.

Figure 3:
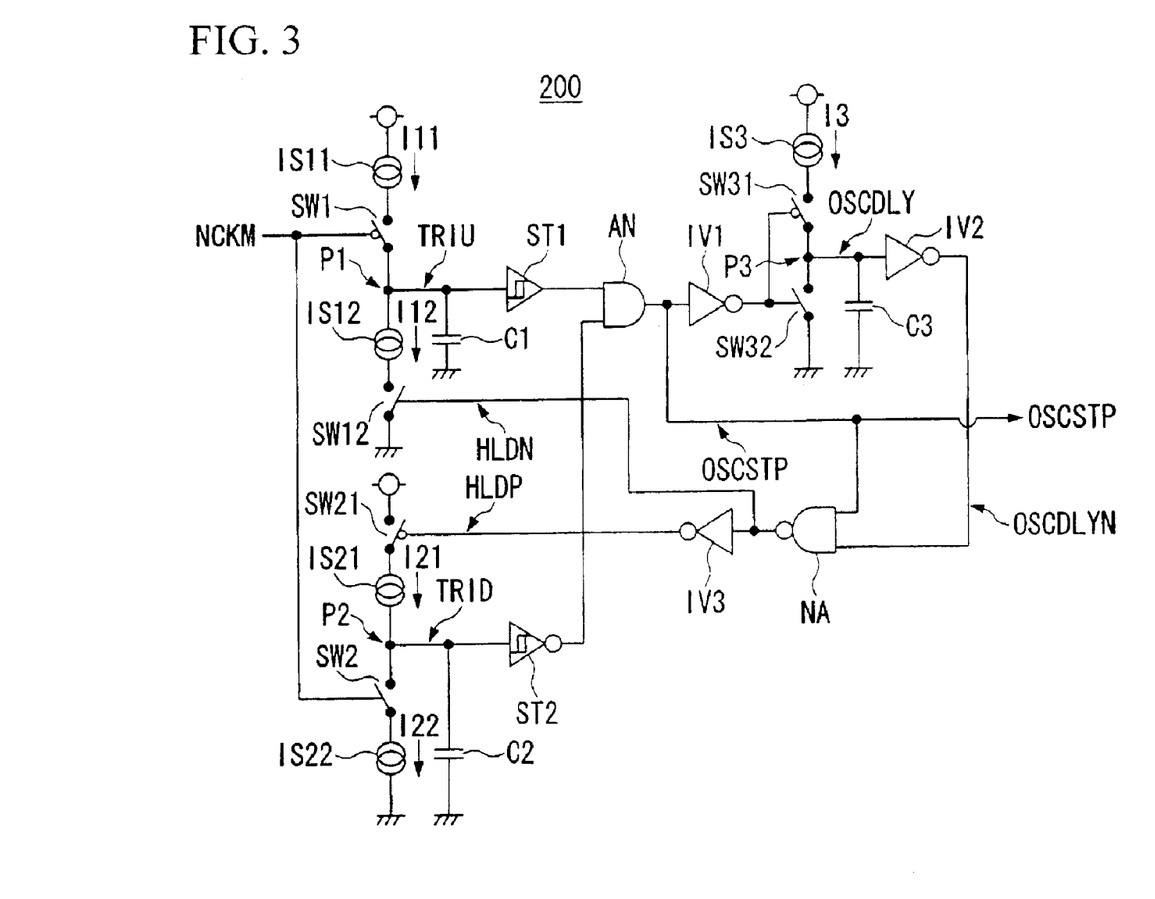
FIG. 3 is a circuit diagram showing the configuration of an oscillation detection circuit in accordance with a second embodiment of the invention.

FIG. 3 shows the configuration of an oscillation detection circuit in accordance with the second embodiment of the invention. Compared with the aforementioned configuration of the oscillation detection circuit 100 shown in FIG. 1, an oscillation detection circuit 200 shown in FIG. 3 is characterized by additionally arranging a current breaking circuit for temporarily breaking the current I12 of the current source IS12 and the current I21 of the current source IS21 upon reception of the output signal of the AND circuit AN. In FIG. 3, parts identical to those shown in FIG. 1 are designated by the same reference numerals; hence, the detailed description thereof will be omitted.

In addition to the aforementioned parts and components included in the oscillation detection circuit of FIG. 1, the oscillation detection circuit 200 of FIG. 3 contains the current breaking circuit, which comprises inverters IV1, IV2, IV3, a current source IS3, switches SW31, SW32, a capacitor C3, and a NAND circuit NA as well as switches SW12 and SW21. Herein, the switch SW12 that operates to open or close in response to a signal HLDN, which will be described later, is arranged on the current path of the current source IS12, i.e., between the current source IS12 and the ground VSS. In addition, the switch SW21 that operates to open or close in response to a signal HLDP, which will be described later, is arranged on the current path of the current source IS21, i.e., between the current source IS21 and the voltage source VDD. The switch SW12 is closed when the signal HLDP is high, while the switch SW21 is closed when the signal HLDP is low.

The AND circuit AN is followed by the inverter IV1, which inverts the detection signal OSCSTP in level and then supplies it to the switches SW31 and SW32. The current source IS3 and the switches SW31 and SW32 are arranged in series between the voltage source VDD and the ground VSS. The switches SW31 and SW32 operate complementary to each other, wherein they open or close in response to the output signal of the inverter IV1. The input terminal of the inverter IV2 is connected with a connection point P3 between the switches SW31 and SW32, and the capacitor C3 is arranged between the connection point P3 and the ground VSS. All the aforementioned inverter IV1, current source IS3, switches SW31 and SW32, capacitor C3, and inverter IV2 are combined together to form a delay circuit for delaying the detection signal OSCSTP, wherein the inverter IV2 outputs a delayed signal OSCDLYN.

Both the detection signal OSCSTP output from the AND circuit AN and the delayed signal OSCDLYN output from the inverter IV2 are supplied to the NAND circuit NA, the output of which is followed by the inverter IV3. Herein, the output signal of the NAND circuit NA is also supplied as the aforementioned signal HLDN to the switch SW12, which is thus opened or closed. The output signal of the inverter IV3 is supplied as the aforementioned signal HLDP to the switch SW21, which is thus opened or closed. The NAND circuit NA and the inverter IV3 are combined together to form a pulse generation circuit, which upon reception of the detection signal OSCSTP, produces the signals HLDN and HLDP, each of which consists of pulses having prescribed pulse widths.

The operation of the oscillation detection circuit 200 of FIG. 3 will be described in detail with reference to FIGS. 4A to 4E.

The oscillation detection circuit 200 is characterized in that after the detection signal OSCSTP becomes high upon detection of an oscillation mode of the oscillation circuit, the current I12 of the current source IS12 and the current I21 of the current source IS21 are temporarily shut off. Incidentally, the second embodiment is basically similar to the foregoing first embodiment in terms of the operation in which the detection signal OSCSTP is produced upon detection of the oscillation circuit; hence, the second embodiment will be described in detail pivotally with respect to the operation being performed after the detection signal OSCSTP becomes high.

In a non-oscillation mode, in other words, when the detection signal OSCSTP is fixedly placed in a low level, the inverter IV1 inverts the detection signal OSCSTP to output a high level, thus controlling the switch SW32 to be closed. At this time, the capacitor C3 is discharged so that a signal OSCDLY emerging at the connection point P3 becomes low, whereby the inverter IV2 inputting the signal OSCDLY produces the delayed signal OSCDLYN of a high level. Therefore, the NAND circuit NA performs a NAND operation on the detection signal OSCSTP and the delayed signal OSCDLYN to produce the signal HLDN of a high level. In addition, the inverter IV3 inverts the signal HLDN to produce the signal HLDP of a low level. In this case, both the switches SW12 and SW21 are simultaneously closed, so that in view of charging and discharging operations of the capacitors C1 and C2, the oscillation detection circuit 200 shown in FIG. 3 as a whole becomes equivalent to the aforementioned oscillation detection circuit 100 shown in FIG. 1.

Figures 4A, 4B, 4C, 4D:
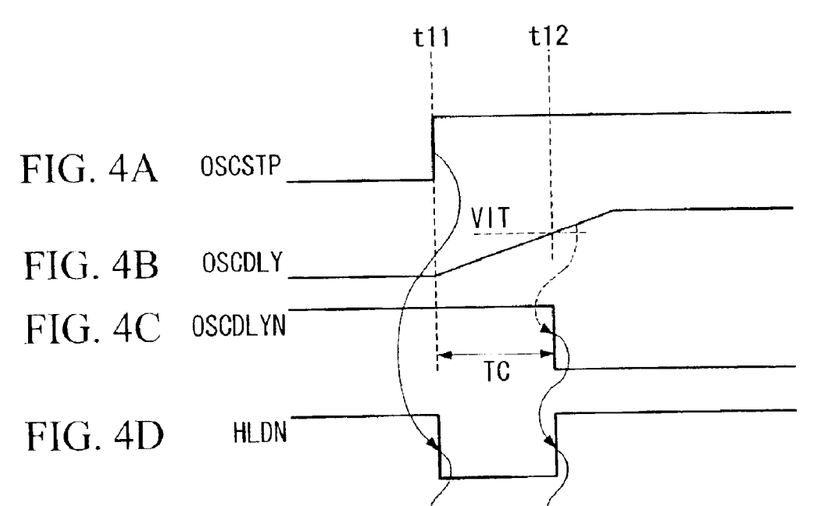
FIG. 4A shows a detection signal OSCSTP output from an AND circuit shown in FIG. 3.
FIG. 4B shows variations of a signal OSCDLY produced based on the detection signal OSCSTP.
FIG. 4C shows a delayed signal OSCDLYN that is produced by inverting the signal OSCDLY.
FIG. 4D shows a signal HLDN produced based on the signals OSCSTP and OSCDLYN.

At time t11 when the detection signal OSCSTP becomes high (see FIG. 4A), the inverter IV1 produces an output signal of a low level, based on which the switch SW31 is closed while the switch SW32 is opened, wherein the capacitor C3 is charged by the current I3 of the current source IS3 so that the signal OSCDLY emerging at the connection point P3 is gradually increased in level (see FIG. 4B). At time t12 when the signal OSCDLY exceeds a prescribed logical threshold VIT, which is set to the inverter IV2 in advance, the inverter IV2 produces the delayed signal OSCDLYN of a low level (see FIG. 4C). That is, the detection signal OSCSTP is delayed by a certain delay time TC, which may be required to charge the capacitor C3 up to approximately a fully charged state, and is then inverted to produce the delayed signal OSCDLYN, which is output from the inverter IV2.

Figure 4E:
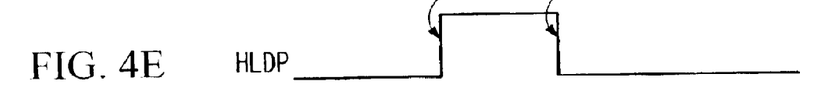
FIG. 4E shows a signal HLDP that is produced by inverting the signal HLDN.

The NAND circuit NA performs a NAND operation on the detection signal OSCSTP and the delayed signal OSCDLYN, both of which are placed in a high level during a prescribed time period between the times t11 and t12, wherein it produces the signal HLDN of a low level (see FIG. 4D), while the inverter IV3 inverts the signal HLDN to produce the signal HLDP of a high level (see FIG. 4E). Upon reception of these signals, both the switches SW12 and SW21 are simultaneously opened during the certain time period between the times t11 and t12, so that both the current I12 of the current source IS12 and the current I21 of the current source IS21 are simultaneously shut off.

When the currents I12 and I21 are shut off, the signals TRIU and TRID emerging at the connection points P1 and P2 are sustained in levels thereof even though the switches SW1 and SW2 are respectively opened. That is, when the switch SW12 is opened, the signal TRIU at the connection point P1 is sustained at an original level established when the switch SW1 is closed. In addition, when the switch SW21 is opened, the signal TRID at the connection point P2 is sustained at an original level established when the switch SW2 is closed.

Therefore, after the signal TRID becomes lower than the low-level logical threshold VIL of the Schmitt trigger ST2, the signal TRID would not be increased any more. Similarly, after the signal TRIU exceeds the high-level logical threshold VIH of the Schmitt trigger ST1, the signal TRIU would not be decreased any more, regardless of the current source IS12. Therefore, it is possible to reliably avoid occurrence of a glitch in the detection signal OSCSTP after the detection signal OSCSTP becomes high.

According to the first embodiment and the second embodiment described above, current sources having different current values, which are set to a prescribed ratio, are used to determine time constants with respect to the signals TRIU and TRID. For this reason, it is possible to detect oscillation of the oscillation circuit in a stable manner without being affected by dispersions of characteristics (e.g., on-resistances) of transistors due to manufacturing conditions, temperatures, supply voltages, and the like. Thus, it is possible to improve the yield in producing LSI (large-scale integration) devices and the like.

In general, LSI devices may have properties in which characteristics of transistors are all varied in the same directivity in response to variations of manufacturing conditions, temperatures, and supply voltages when transistors are arranged in prescribed layout patterns in conformity with prescribed directions. That is, it may not be easy to improve absolute characteristic values of devices; however, it may be relatively easy to realize uniform ratios between (absolute) characteristic values of devices. This invention is actualized by paying attention to the aforementioned properties. That is, parts (e.g., transistors and resistors) of the current sources IS11 and IS12 are adjusted in advance in such a way that characteristic values thereof may be varied substantially in the same directivity, wherein it is possible to maintain a certain ratio between the currents I11 and I12, regardless of variations of characteristic values of parts of the current sources IS11 and IS12. Therefore, even though some dispersions occur in on-resistances of transistors constituting current sources, it is possible to normally perform charging and discharging operations (or integrating operations) on capacitors; hence, it is possible to stabilize the operation of the oscillation detection circuit.

3. Applications

The foregoing oscillation detection circuits can be adapted to various types of circuitry, examples of which will be described with reference to FIGS. 5 and 6.

Figure 5:
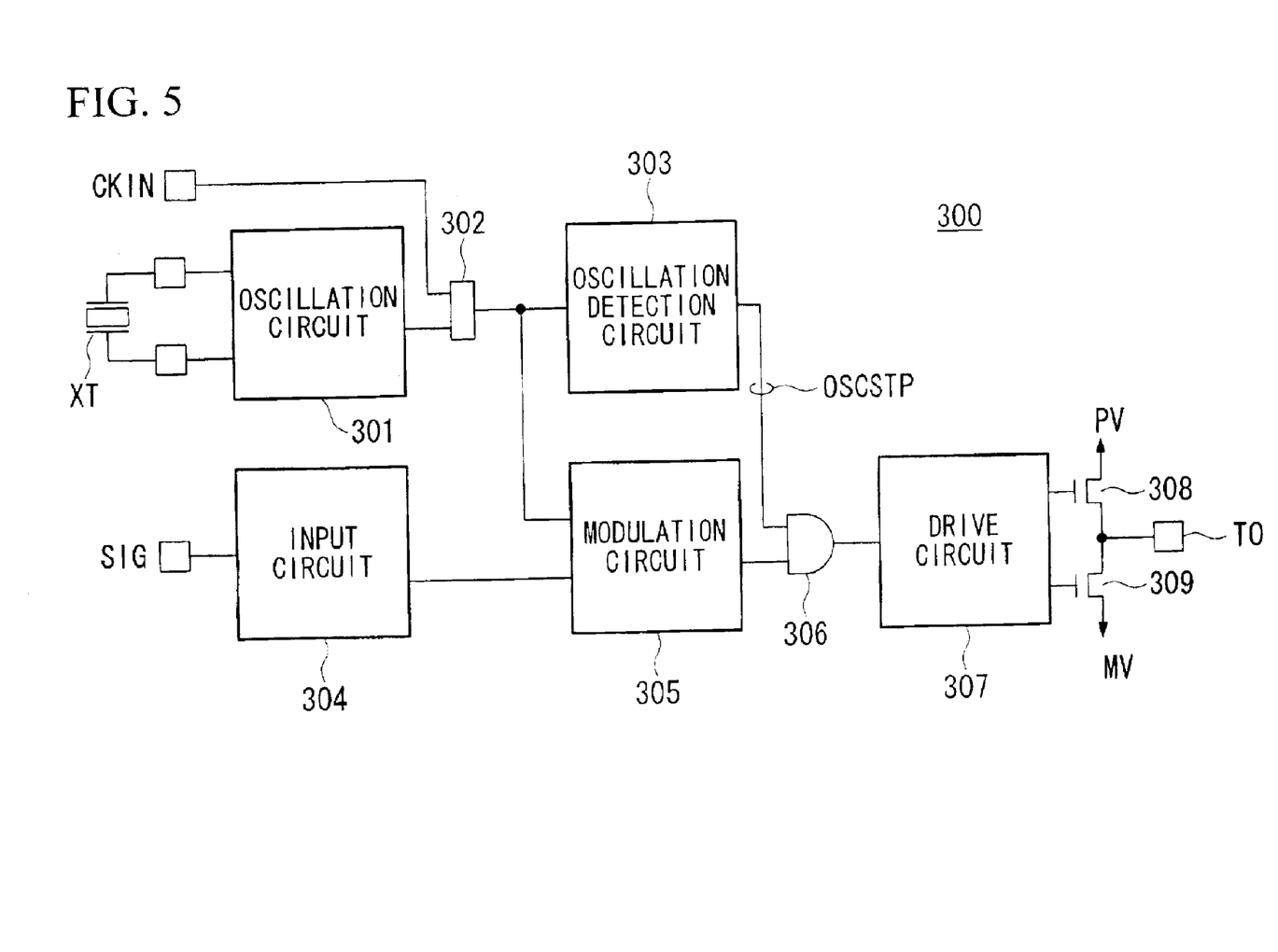
FIG. 5 is a block diagram showing a class-D amplifier to which the oscillation detection circuit is adapted.

FIG. 5 shows a first application, that is, an example of a class-D amplifier 300 of an externally excited oscillation type to which the oscillation detection circuit (denoted by reference numeral 303) is adapted. Herein, the oscillation detection circuit 303 shuts off signals being transmitted from a modulation circuit 305 to a drive circuit 307 when an oscillation circuit 301 stops oscillation, thus avoiding leakage of sound in a speaker (not shown). Specifically, a crystal vibrator (or oscillator) XT is arranged externally of the oscillation circuit 301, wherein either the output signal (or oscillation signal) of the oscillation circuit 301 or an external clock signal CKIN is selected by a selector 302 and is distributed to both the oscillation detection circuit 303 and the modulation circuit 305.

The modulation circuit 305 receives one of the oscillation signal and the clock signal, selected by the selector 302, as a carrier signal, based on which musical tone signals SIG, input from an input device 304, are subjected to pulse-width modulation (PWM) to produce pulse-width modulated (or PWM) signals consisting of pulses. The PWM signals are supplied to the drive circuit 307 via an AND circuit 306, so that the drive circuit 307 drives a pair of power transistors (i.e., MOS transistors) 308 and 309 to be conducted in a complementary manner. Thus, it is possible to produce pulse signals consisting of pulses whose pulse widths reflect magnitudes of musical tone signals SIG, which are output from an output terminal TO. The output terminal TO is connected with a speaker (or speakers) via a low-pass filter for removing carrier signal components from pulse signals, so that appropriate analog signals are supplied to the speaker (s).

The class-D amplifier 300 of the externally excited oscillation type operates based on the oscillation signal output from the "internal" oscillation circuit 301 or the external clock signal CKIN. The oscillation detection circuit 303 detects one of the oscillation signal and clock signal, which is selected by the selector 302 and is supplied to the modulation circuit 305, to produce a detection signal OSCSTP, which is then supplied to the AND circuit 306. That is, in an oscillation stop mode or when the clock signal is not applied, the output signal of the AND circuit 306 is fixed to a low level, thus preventing musical tone signals SIG input to the input device 304 from being directly transmitted to the drive circuit 307 without being controlled. Thus, it is possible to prevent the speaker(s) from being driven by disordered or confused signals.

Figure 6:
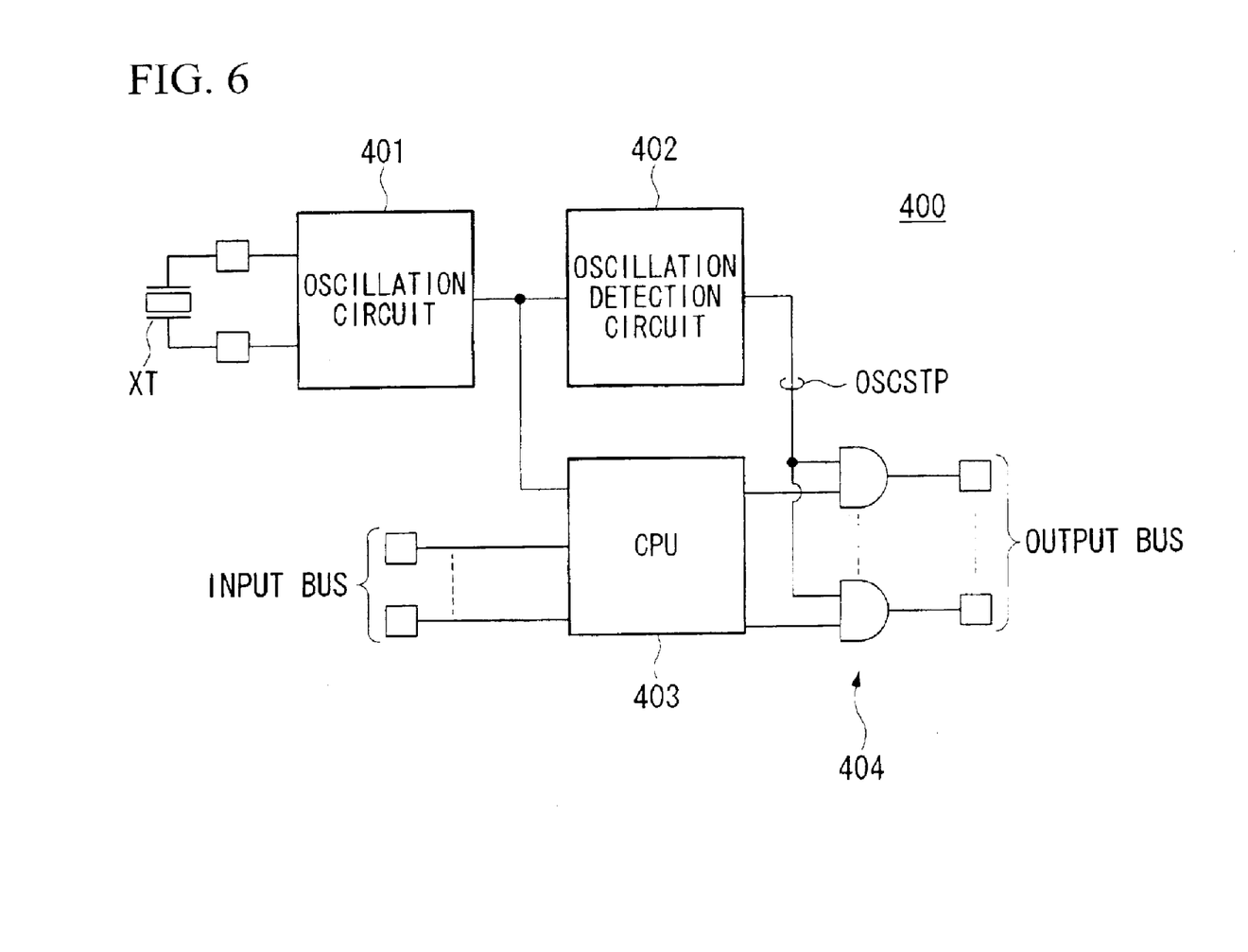
FIG. 6 is a block diagram showing a processing circuit to which the oscillation detection circuit is adapted.

FIG. 6 shows a second application, that is, an example of a processing circuit (denoted by reference numeral 400) incorporating a central processing unit (CPU) 403 to which the oscillation detection circuit (denoted by reference numeral 402) is adapted. That is, an oscillation circuit 401, an oscillation detection circuit 402, and AND circuits 404 shown in FIG. 6 respectively correspond to the oscillation circuit 301, oscillation detection circuit 303, and AND circuit 306 shown in FIG. 6; hence, the detailed description thereof will be omitted. In the processing circuit 400, the oscillation detection circuit 402 detects an oscillation stop mode of the oscillation circuit 401 to produce a detection signal OSCSTP, based on which all the output signals of the AND circuits 404 are fixed to a low level. Thus, all lines of an output bus of the CPU 403 are fixedly set to a low level, which makes the CPU 403 uncontrollable so that no signal can be output onto the output bus.

This invention is not necessarily limited to the aforementioned embodiments; therefore, it is possible to provide various modifications realizing design choices and the like without departing from the essential matter of this invention. For example, the first embodiment is directed to the oscillation detection circuit 100 shown in FIG. 1, which comprises a first circuitry comprising the current sources IS11, IS12, switch SW1, capacitor C1, and Schmitt trigger ST1, and a second circuitry comprising the current sources IS21, IS22, switch SW2, capacitor C2, and Schmitt trigger ST2, wherein it is not always required to arrange two series of circuitry; that is, it is possible to arrange only one circuitry if the output signal NSKM of the oscillation circuit can be directly fixed to a certain level in a non-oscillation mode. Specifically, when the output signal NCKM can be fixed to a low level in a non-oscillation mode, it is possible to arrange only the second circuitry. In contrast, when the output signal NCKM can be fixed to a high level in a non-oscillation mode, it is possible to arrange only the first circuitry. In this case, the AND circuit AN is not required, so that the output signal of the Schmitt trigger ST1 or ST2 is directly used as the detection signal OSCSTP.

As described heretofore, this invention has a variety of effects and technical features, which will be described below.

(1) An oscillation detection circuit of this invention comprises at least one circuitry incorporating a first current source for charging a capacitor and a second current source for discharging the capacitor, which are controlled to be connected in series or disconnected in response to an oscillation signal output from an oscillation circuit, so that a signal emerging at a connection point between the first and second current sources is integrated and is then subjected to waveform shaping, thus producing a binary signal. Therefore, it is possible to detect an oscillation mode of the oscillation circuit in a stable manner without being affected by dispersions or variations of characteristics of transistors.

(2) Specifically, when the first and second current sources are disconnected, the potential of the connection point is varied by the second current source. When they are connected in series, the potential of the connection point is varied in response to difference between current values of the first and second current sources. Due to repetition of connected and disconnected states between the first and second current sources, the signal emerging at the connection point is integrated and is gradually increased or decreased to a certain voltage, wherein it is then subjected to waveform shaping to produce a binary signal, from which ripple due to the oscillation signal is being removed. Therefore, when the first and second current sources are initially disconnected in a non-oscillation mode of the oscillation circuit, the integrated signal level differs in response to the oscillation mode and non-oscillation mode, the distinction of which is reflected on the binary signal. Therefore, it is possible to easily distinguish between the oscillation mode and the non-oscillation mode based on the binary signal.

(3) In addition, it is possible to additionally arrange a current breaking circuit for temporarily making the first current source or the second current source inoperable as necessary, whereby it is possible to completely eliminate ripple contained in the signal at the connection point, thus avoiding occurrence of glitch in the detection signal.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. An oscillation detection circuit for detecting an oscillation mode of an oscillation circuit, comprising:
   a first current source for producing a first current;
   a second current source for producing a second current;
   a capacitor that is connected with a connection point between the first and second current sources, wherein the capacitor is charged in response to the first current and is discharged in response to the second current;
   a switch arranged between the first current source and the second current, wherein the switch operates to connect the first and second current sources in series or to disconnect them in response to an output signal of the oscillation circuit, so that a signal emerging at the connection point is gradually increased or decreased as the output signal of the oscillation circuit is periodically changed in level in the oscillation mode; and
   a Schmitt trigger for producing a detection signal based on the signal at the connection point between the first and second current sources, wherein presence of the oscillation mode and a length of time since commencement of the oscillation mode are detected based on the detection signal.

2. An oscillation detection circuit comprising:
   a first current source;
   a second current source;
   a first switch for connecting the first current source and the second current source in series or for disconnecting them in response to an output signal of an oscillation circuit;

a capacitor that is charged by the first current source and is discharged by the second current source;

a first Schmitt trigger for producing a first binary signal based on a first signal that emerges at a connection point between the first and second current sources and is gradually increased in level as the output signal of the oscillation circuit is periodically changed in level in an oscillation mode;

a third current source;

a fourth current source;

a second switch for connecting the third current source and the fourth current source in series or for disconnecting them in response to the output signal of the oscillation circuit;

a second capacitor that is charged by the third current source and is discharged by the fourth current source;

a second Schmitt trigger for producing a second binary signal based on a second signal that emerges at a connection point between the third and fourth current sources and is gradually decreased in level as the output signal of the oscillation circuit is periodically changed in level in the oscillation mode; and an logical circuit for producing a detection signal based on the binary signals respectively output from the first and second Schmitt triggers.

3. An oscillation detection circuit according to claim 1 further comprising a current breaking circuit for temporarily making the first or second current source inoperable in response to the detection signal.

4. An oscillation detection circuit according to claim 2 further comprising a current breaking circuit for temporarily making the second current source and the third current source inoperable in response to the detection signal.

5. An oscillation detection circuit according to claim 4, wherein the current breaking circuit comprises a pulse generation circuit for generating a pulse signal whose pulse width is controlled in response to the detection signal, a third switch for making the second current source disconnected in response to the pulse signal, and a fourth switch for making the third current source disconnected in response to the pulse signal.

* * * * *